(12) United States Patent
Lindner et al.

(10) Patent No.: US 7,496,136 B2
(45) Date of Patent: Feb. 24, 2009

(54) PHASE LOCKED LOOP AND METHOD FOR EVALUATING A JITTER OF A PHASE LOCKED LOOP

(75) Inventors: Manfred Lindner, Unterhaching (DE); Roland Schwenk, Oberhaching (DE)

(73) Assignee: Infineon Technologies AG, Munich (DE)

(*) Notice: Subject to any disclaimer, the term of this patent is extended or adjusted under 35 U.S.C. 154(b) by 620 days.

(21) Appl. No.: 11/058,964

(22) Filed: Feb. 16, 2005

(65) Prior Publication Data

US 2005/0207522 A1 Sep. 22, 2005

(30) Foreign Application Priority Data

Feb. 17, 2004 (DE) .................. 10 2004 007 648

(51) Int. Cl.
*H04B 3/46* (2006.01)
*H03D 3/24* (2006.01)

(52) U.S. Cl. ..................... 375/226; 375/376
(58) Field of Classification Search ......... 375/371–376, 375/224, 226; 331/16, 45, 185; 327/153, 327/246, 141, 155, 162; 348/64, 549
See application file for complete search history.

(56) References Cited

U.S. PATENT DOCUMENTS

| | | | | |
|---|---|---|---|---|
| 5,546,052 A * | 8/1996 | Austin et al. | ................. | 331/1 A |
| 5,563,552 A * | 10/1996 | Gersbach et al. | ............. | 331/1 A |
| 5,663,991 A * | 9/1997 | Kelkar et al. | ................. | 375/376 |
| 5,724,007 A * | 3/1998 | Mar | ........................... | 331/1 A |
| 5,754,437 A * | 5/1998 | Blazo | ........................... | 702/75 |
| 5,784,122 A * | 7/1998 | Nayebi et al. | ................ | 348/549 |
| 5,889,435 A * | 3/1999 | Smith et al. | ................... | 331/1 A |
| 6,441,602 B1 * | 8/2002 | Eckhardt et al. | ......... | 324/76.53 |
| 6,661,266 B1 * | 12/2003 | Variyam et al. | ............. | 327/159 |
| 7,082,178 B2 * | 7/2006 | Meltzer | ....................... | 375/376 |
| 2003/0100265 A1 * | 5/2003 | Wang et al. | ................. | 455/67.3 |
| 2003/0112915 A1 * | 6/2003 | Meltzer | ...................... | 375/376 |
| 2004/0251970 A1 * | 12/2004 | Fayneh et al. | .................. | 331/16 |
| 2005/0046486 A1 * | 3/2005 | Miki et al. | ..................... | 331/17 |

FOREIGN PATENT DOCUMENTS

EP 1383023 A2 * 1/2004
EP 1398879 A1 * 3/2004

OTHER PUBLICATIONS

Ilya I. Novof et al., "Fully Integrated CMOS Phase-Locked Loop with 15 to 240 MHz Locking Range and ±50 ps Jitter", IEEE journal of Solid-State Circuits, vol. 30, No. 11 on Nov. 1995. pp. 1259-1266.*
"On-Chip Jitter Measurement for Phase Locked Loops", Tian Xia and Jien-Chung Lo, Proceedings of the 17th IEEE International Symposium on Defect and Fault Tolerance in VLSI Systems, (DFT '02), Nov. 2002, 10 pgs.
"Elektronik für Ingenieure", Hering, Bressler and Gutekunst, Springer, 12 pgs., no date available.

* cited by examiner

*Primary Examiner*—Tesfaldet Bocure
(74) *Attorney, Agent, or Firm*—Eschweiler & Associates, LLC

(57) ABSTRACT

A phase locked loop is disclosed having a phase detector and a controllable oscillator coupled to the detector. A frequency divider is also included in a feedback path of the phase locked loop. The phase locked loop further comprises an evaluation means that facilitates an evaluation of a jitter of the phase locked loop. This allows an on-chip evaluation of the jitter of a phase locked loop to be performed.

20 Claims, 2 Drawing Sheets

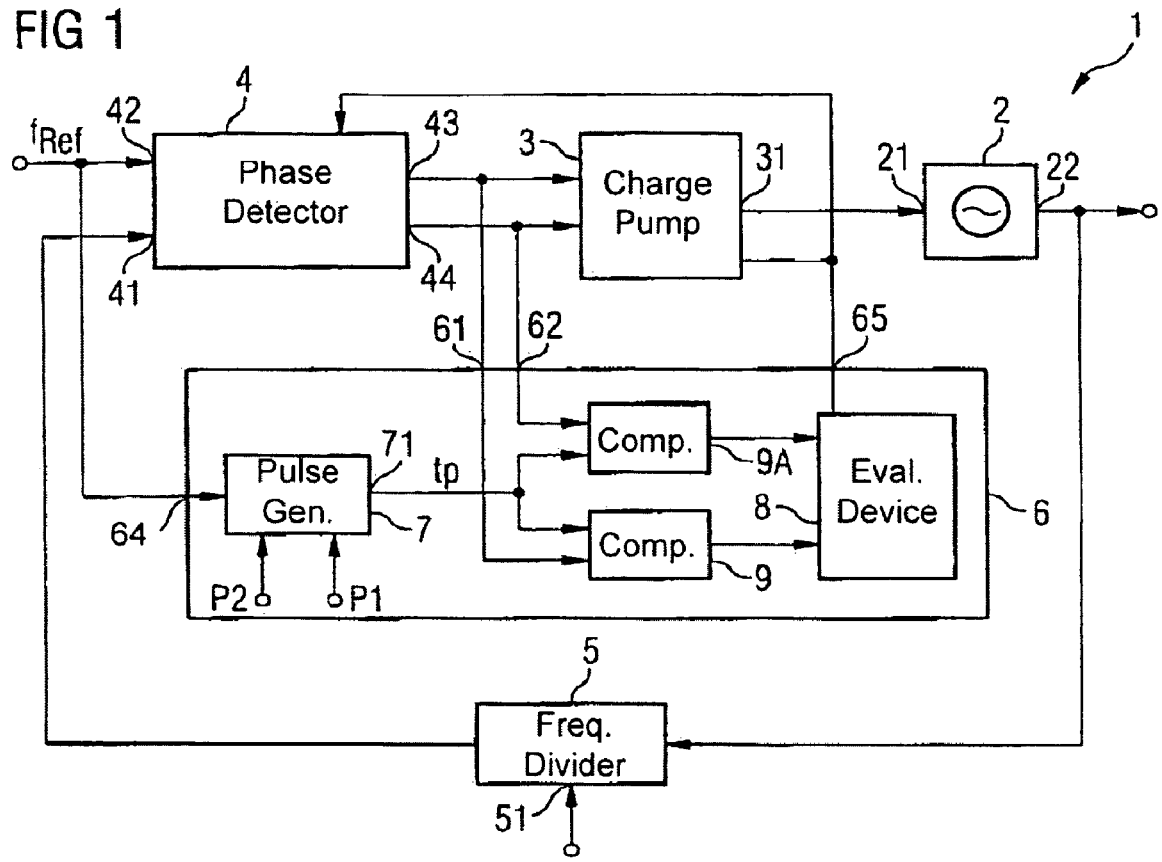
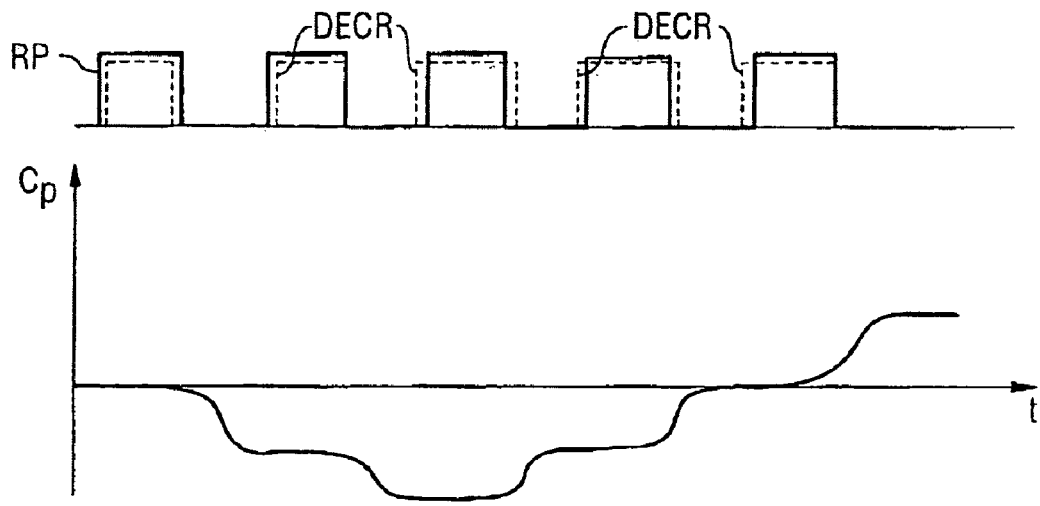

PHASE LOCKED LOOP AND METHOD FOR EVALUATING A JITTER OF A PHASE LOCKED LOOP

REFERENCE TO RELATED APPLICATIONS

This application claims the benefit of the priority date of German application DE 10 2004 007 648.0, filed on Feb. 17, 2004, the contents of which are herein incorporated by reference in their entirety.

FIELD OF THE INVENTION

The invention relates generally to a phase locked loop, and more particularly to evaluating a jitter of a phase locked loop.

BACKGROUND OF THE INVENTION

Phase locked loops are used primarily for locking on and holding a frequency of an oscillator with respect to a fixedly determined reference frequency. A high frequency stability and phase stability of the oscillator are achieved thereby. One example of a phase locked loop is included in: Gehrung, Bressler, Gutekunst, "Elektronik für Ingenieure" [Electronics for Engineers], 3rd edition, Springer, 1998, on pages 509-519, which schematically shows a basic circuit of a phase locked loop, called PLL for short.

The PLL shown therein comprises a forward path having a phase comparator, a low-pass filter and also the oscillator to be regulated, and a backward path having a frequency divider. An important constituent part is the phase comparator, which compares the fed-back signal $U_N$ with a reference signal $U_{Ref}$ and generates a control signal $U_{UPD}$ therefrom. In the exemplary embodiment, said control signal is forwarded to a low-pass filter, at the output of which a control voltage $U_{TP}$ readjusts the frequency of the voltage-controlled oscillator embodied in the present example. The output signal of the oscillator VCO is divided by means of the frequency divider N in the backward path and supplied again to the feedback input of the phase comparator.

In this case, the regulating signal UPD of the phase comparator PD may be present for example in the form of signal pulses of different length with a positive or negative amplitude, depending on the phase shift between the reference signal $U_{Ref}$ and the fed-back and divided signal $U_N$ of the oscillator VCO.

If the frequency of the fed-back signal $U_N$ is equal to the frequency of the reference signal $U_{Ref}$ and if the signals have a fixed phase relationship with respect to one another, then the phase detector no longer generates a control signal $U_{UPD}$ and the voltage-controlled oscillator is locked on. However, small current and voltage fluctuations in the oscillator generate a phase noise in the output signal, thereby widening the spectrum of the oscillator signal. This widening is partly corrected by the phase locked loop. In this case, the regulating bandwidth results from the charge pump operating as a low-pass filter.

The measurement of the phase noise of a phase locked loop therefore permits conclusions to be drawn regarding a quality factor and the performance of the phase locked loop. However, a phase noise measurement of a phase locked loop is possible only with great complexity.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. One or more aspects of the invention provide a phase locked loop with which a performance evaluation is possible using simple means. Further, a method for generating an evaluation signal for a jitter in a phase locked loop is provided.

A phase locked loop according to one or more aspects of the present invention comprises a phase detector having a reference input for supplying a first reference signal and having a feedback input. A controlled oscillator is coupled by its control input to an output of the phase detector. The coupling is preferably effected via a loop filter. The phase locked loop further comprises a frequency divider in a feedback path of the phase locked loop, the frequency divider comprising an input connected to an output of the controlled oscillator and being coupled by an output to the feedback input of the phase detector. The phase locked loop contains an evaluation means comprising a comparison apparatus. The latter is designed for comparison of a control signal output at the output of the phase detector with a second reference signal. The evaluation means has an output for outputting a signal that is dependent on said comparison and can be temporally averaged.

According to the invention, then, an evaluation of the phase locked loop is no longer effected by means of a phase noise measurement of an oscillator signal at the output, but rather by means of the assessment of the control signal of the phase detector with a reference signal. This design can be realised monolithically in a particularly simple manner in a semiconductor body in the form of an integrated circuit or in a chip. Moreover, the phase locked loop can be evaluated continuously and in the course of operation.

In one development of the invention, the phase detector is designed for outputting a pulse-width-modulated control signal to the output. In this case, the pulse width is a measure of the intensity of the phase deviation between the reference signal and the fed-back oscillator signal. If the phase deviation is very small or if it disappears completely, then the control signal is also present merely in the form of a very short pulse.

In one example, the evaluation means comprises a pulse generator circuit which generates a reference pulse signal having an adjustable pulse width. An output of the pulse generator circuit is coupled to the comparison apparatus. As a result, it is advantageously possible for the pulse widths of the control signal of the phase detector to be compared with a reference pulse width and for the evaluation signal to be generated therefrom. In this case, the set pulse width of the pulse generator circuit is preferably the minimum width of the control signal at the output of the phase detector.

It is expedient in this connection if the pulse generator circuit comprises an input for supplying a reference signal, which input is coupled to the reference input of the phase detector. This results in generation of the reference pulse signal with an adjustable pulse width and of the control signal with a fixed phase relationship, since both are derived from the reference signal.

In another example, the evaluation means comprises a capacitance-adjustable charge store. The latter is connected to a reference potential by one terminal and to an output of the comparison apparatus by its other terminal. The capacitance-adjustable charge store is thus advantageously designed for temporal averaging of the signal dependent on the comparison at the output of the comparison apparatus. By setting the capacitance of the charge store, it is possible to alter the observation time period for an observation. This is particularly practical if the comparison apparatus, per comparison operation, supplies one signal with two logic states at the output. Consequently, averaging over a plurality of comparisons carried out by the comparison apparatus is possible by means of a corresponding setting.

In another example, the output of the phase detector is coupled to the control input of the oscillator via a first charge pump and a second charge pump connected in parallel with the first charge pump. In this case, the second charge pump is designed for outputting a signal that is proportional to the control signal output by the phase detector. This significantly increases the stability of the regulation on account of the two charge pumps. It is advantageous, moreover, for the two charge pumps, which may also be constructed identically, to be connected to the phase detector with respectively interchanged inputs and outputs. Thus, a first input of a first charge pump is connected to a first output terminal of the phase detector and a second input of the first charge pump is connected to a second output terminal of the phase detector. A first and a second input of the second charge pump are respectively connected to the second and first output terminal of the phase detector.

A method according to one or more aspects of the present invention for evaluating a jitter of a phase locked loop comprises, in addition to the provision of the phase locked loop having a phase detector for outputting a pulse-width-modulated actuating signal to an actuating output coupled to an oscillator, comparison of a control signal output by the phase detector with a reference signal, and also generation of an evaluation signal. Therefore, for the purpose of evaluating a jitter, use is no longer made of the output signal of the oscillator in the phase locked loop, but rather of the control signal of the phase detector. The method can consequently be embodied without relatively great expenditure directly with an integrated circuit and preferably in a single semiconductor body.

It is expedient to embody the comparison of the control signal with a reference signal by provision of a pulse width generator for generation of a reference pulse and comparison of the pulse widths of the reference pulse with the pulse widths of the control signal. Subsequently, in a simplified manner, the pulse widths of the reference pulse are compared with the pulse widths of the control signal of the phase detector. This can be implemented particularly simply by means of circuits.

It is furthermore expedient to feed the phase detector and also the pulse width generator with a reference signal. In this case, the phase detector compares the phase of the reference signal with the fed-back oscillator signal, and the pulse width generator uses the reference signal for generating a reference pulse. In a suitable embodiment, this enables a fixed phase relationship between the reference pulse and the actuating signal output by the phase detector.

In one example, the evaluation signal is generated in a charge store provided therefor. This is effected by charging or discharging the charge store by a defined quantity of charge in a manner dependent on the comparison of the reference signal with the control signal. The evaluation signal is derived from a voltage dropped across the charge store.

This allows an assessment of a temporal profile of the evaluation signal for an evaluation of a jitter of the phase locked loop. Such an assessment permits a precise evaluation of the phase noise and of the jitter performance of the phase locked loop in a manner dependent on the pulse width of the reference pulse and also the observation time duration.

BRIEF DESCRIPTION OF THE DRAWINGS

The invention is explained in more detail below wherein reference is made to the following drawings.

FIG. 1 is a schematic block diagram illustrating an exemplary phase locked loop according to one or more aspects of the present invention.

FIG. 3 illustrates a temporal voltage profile of an evaluation signal according to one or more aspects of the present invention.

DETAILED DESCRIPTION OF THE INVENTION

Figure 2:
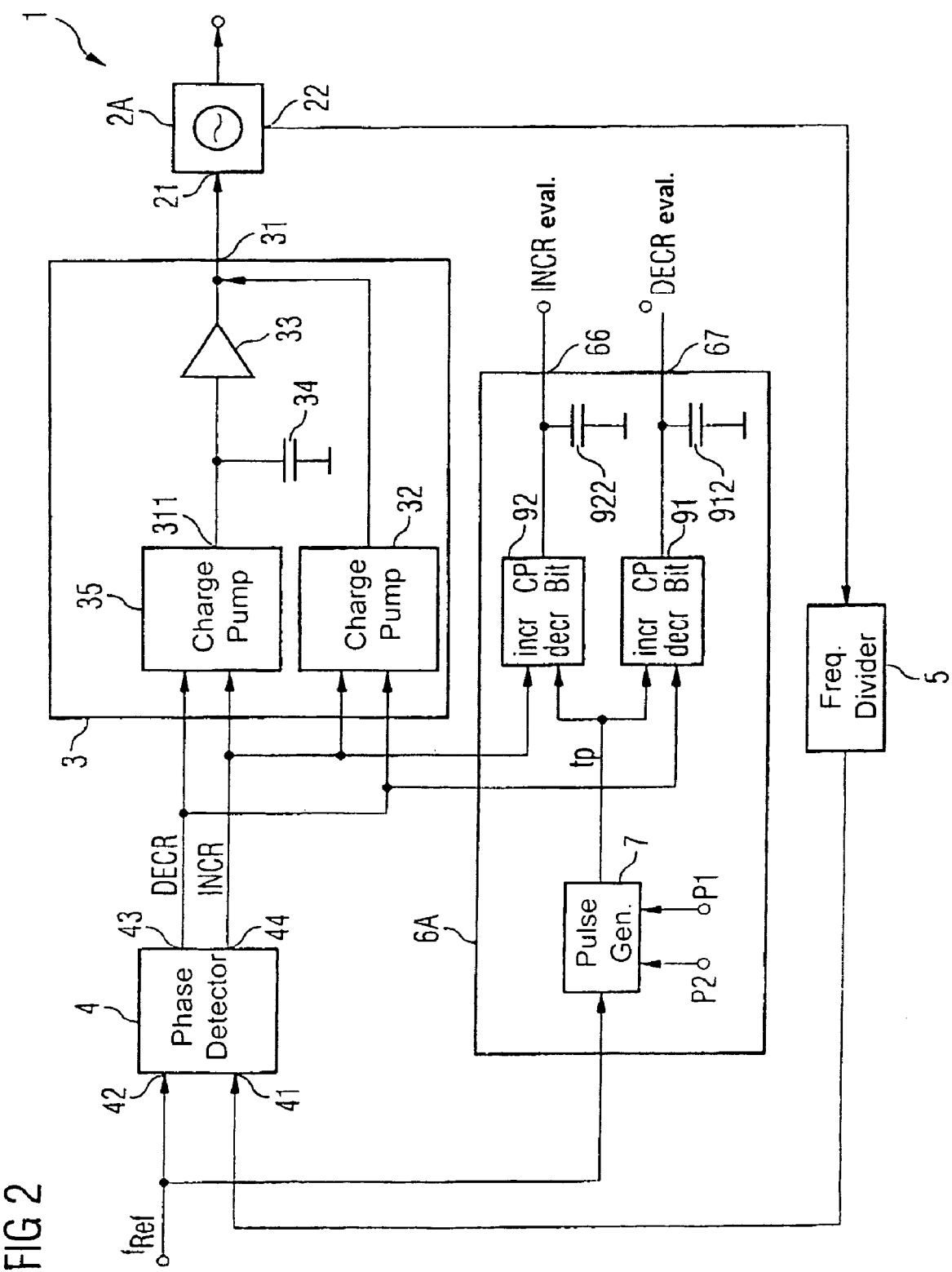
FIG. 2 is a schematic block diagram illustrating another exemplary phase locked loop according to one or more aspects of the present invention.

One or more aspects of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. Thus, it will be appreciated that variations of the illustrated systems and methods apart from those illustrated and described herein may exist and that such variations are deemed as falling within the scope of the present invention and the appended claims.

FIG. 1 illustrates a phase locked loop 1 according to one or more aspects of the present invention having a voltage-controlled oscillator 2. The latter comprises a control input 21 and also an output 22, which simultaneously forms the output of the phase locked loop 1. The output 22 of the voltage-controlled oscillator 2 is connected to a feedback path comprising a controllable frequency divider 5. The divider ratio between the frequency of a signal present at the input of the frequency divider 5 and the frequency of the signal that can be tapped off at the output is adjustable by means of a control signal at the input 51. The output 52 of the frequency divider 5 is connected to a feedback input 41 of a phase detector 4. The phase detector 4 additionally comprises a reference input 42 for supplying a reference signal $f_{Ref}$. The phase detector 4 compares the phase of a signal present at the feedback input 41 with the phase of the reference signal $f_{Ref}$ at the reference input 42 and generates an actuating control signal in a manner dependent on the comparison. The control signal is output in the form of pulses at one of the output terminals 43 or 44.

The pulse length is a measure of the phase difference between the fed-back signal and the reference signal. Depending on whether the phase of the feedback signal leads or lags behind the phase of the reference signal, a pulse signal is output at the terminal 43 or 44. If no phase difference occurs, then the oscillator is locked onto its desired frequency and the phase detector 4 generates a pulse having an identical length at the output terminals 43 and 44. The terminals 43 and 44 are connected to inputs of a charge pump 3. The latter simultaneously acts as a low-pass filter and generates an actuating signal at its output 31 from control signals present on the input side, said actuating signal being supplied to the actuating input of the voltage-controlled oscillator 2.

In this example, the phase locked loop also comprises an evaluation means 6 having a first terminal 61 and a second terminal 62 for supplying the actuating signals output by the phase detector 4. For this purpose, the input 61 is connected to the output 43 and the input 62 is connected to the output 44 of the phase detector 4. Further, the evaluation means 6 contains a reference input 64 and also a control output 65.

The evaluation means 6 additionally has a pulse width generator 7 having a reference input and also a control input for two control signals P1 and P2. The reference input is connected to the reference input 64. The pulse width generator is connected by its signal output 71 to a first and also a second comparison device 9 and 9A. In this case, the output of the pulse width generator 7 is connected to the first input of the comparison device 9 and to the second input of the comparison device 9A. The comparison device 9 further contains a second input connected to the input 61 of the evaluation means, and the comparison device 9A comprises a first input connected to the input 62. Respective outputs of the two comparison devices 9, 9A are connected to an evaluation apparatus 8, which comprises an actuating output that leads to the output 65 of the evaluation unit 6.

The pulse width generator 7 generates, from the reference signal $f_{Ref}$ with the two control signals P1 and P2, a pulse tp having an adjustable pulse width and supplies said pulse to the comparison devices 9 and 9A. In the comparison devices 9 and 9A, the reference pulse width is compared with the present pulse widths of the signals at the output terminals 43 and 44 of the phase detector 4. The result is present in the form of a signal comprising two possible logic states, a logic "0" and a logic "1". A new comparison is carried out at specific time intervals, for example in the event of each actuating pulse, and the results are averaged temporally. The average is supplied to the evaluation apparatus 8, which assesses the signal profile.

In the case of an ideal phase locked loop, the pulses output at the output terminals 43 and 44 have the same width as the reference pulse tp generated by the pulse width generator 7. This has the effect in the comparison apparatuses 9 and 9A that the output signal of the comparison devices 9 and 9A disappears on average over time. As a result of pulse width fluctuations in the phase detector 4 or external disturbances such as, by way of example, drift or jitter of the voltage-controlled oscillator, the phase detector generates on average on a control signal line 43 or 44 pulses having widths that are different from the reference pulse width. This is registered by the comparison devices 9 and 9A and supplied to the evaluation unit 8, which thereupon outputs at its control output a signal either to the charge pump 3 or to the phase detector 4. This signal serves for altering internal parameters in order thus, by way of example, to compensate for an undesired jitter or a drift.

A second exemplary embodiment is illustrated in FIG. 2, wherein identical components bear identical reference symbols to those presented in FIG. 1. The phase detector 4 of the phase locked loop outputs pulses of identical length at the terminals 43 and 44. This is effected with different frequency, however, depending on the phase difference. With the aid of the control signals P1 and P2 present, the pulse width generator 7 generates pulses having the same width as the actuating pulses. If the pulse widths between the reference pulses tp and the actuating pulses are exactly identical, then no output signal of the comparison device 9 and 9A is produced on average over time. The output signal or the amplitude of the output signal disappears on average. However, jitter or disturbances in the phase detector lead to a slight fluctuation in the pulse width of the actuating signals. These fluctuations are detected by the evaluation unit 6 and its comparison device since the pulse width of the reference pulse remains the same. A direct jitter evaluation of the phase detector circuit can thus be performed in this embodiment.

The term jitter evaluation is in this case understood to mean the processing of a signal which represents a measure of the jitter or the deviation from a desired value. In this case, the desired value is given by the pulse width of the reference pulse. Deviations therefrom result on account of phase fluctuations in the oscillator in accordance with the first embodiment, and on account of fluctuations in the phase detector in the second embodiment. It is thus possible to make a statement about the performance of the phase locked loop or individual elements of the regulating circuit in a manner dependent on this evaluation.

The phase locked loop in FIG. 2 comprises a current-controlled oscillator 2A, which is connected by its output to the frequency divider 5 in the feedback path. The phase detector 4 is designed in the same way and generates the pulse signal DECR at its first output terminal 43 and the pulse signal INCR at its output terminal 44, which again control the charge pump 3. The charge pump 3 comprises two individual charge pumps 35 and 32 connected in parallel. Their inputs are connected to the output terminals 43 and 44 in an interchanged fashion. In the case of INCR and DECR pulses of identical length, a jitter in the pulses is thus automatically compensated for. The charge pump 35 generates integrated current pulses from the INCR and DECR pulses and outputs them to its output 311. The current signal which is output is converted into a voltage signal, and integrated, by means of a capacitor 34 operating as a low-pass filter. The integrated voltage signal is converted into a current signal again in a voltage-current converter 33.

The second charge pump 32 generates a current signal proportional to the INCR and DECR pulses and supplies it to the actuating input 21 of the current-controlled oscillator 2A. In the same way, the current signal integrated by the first charge pump 35 is also supplied to the control input 21.

The evaluation unit 6A here comprises, in addition to the pulse width generator 7 that is connected by its output to a first input incr of a comparison circuit 91 and also a second input decr of a comparison circuit 92, respective capacitors 912 and 922 operating as low-pass filters, which capacitors are in each case connected to the output of the comparison circuits 91 and 92, respectively. The respective second inputs decr and incr of the comparison circuits 91 and 92 which are not connected to the pulse width generator 7 are connected to the output terminals 43 and 44, respectively, of the phase detector 4.

The two capacitors 912 and 922 are variable in terms of their capacitance, and as a result it becomes possible to alter the observation time period for the evaluation. The comparison circuits 91 and 92 are designed in such a way that they output a signal having a first logic state, for example the logic "0", at their output if the pulse width of the reference pulse tp is smaller than the pulse width of the signals output by the phase detector 4. Otherwise, a signal having a second logic state, the logic "1" is output to the output. The result of the comparison is thus stored on the capacitors 912 and 922 and integrated across a plurality of comparisons during an observation time period. If the widths of the pulses DECR and INCR are equal to the width of the reference pulse tp, then no charge is stored on the capacitors 912 and 922 on average over time. Otherwise, a voltage results across one of the two capacitors, which is used at the evaluation output terminals 66 and 67 for evaluating a jitter in the DECR and INCR signal.

Such a voltage profile over time is shown by way of example in FIG. 3. Subfigure A shows the temporal profile of a reference pulse RP in solid form compared with the DECR and INCR pulses beset by jitter, which are illustrated in dashed form. The second subfigure shows the voltage Cp across the capacitor 912 or 922 over time t. The voltage profile across the capacitor 912 changes over time t on account of the jitter, which leads to different pulse widths in the DECR pulse (e.g., as compared to the reference pulse RP). The assessment of such a voltage thus permits conclusions to be drawn regarding the jitter performance of the phase locked loop. A complicated measurement using external auxiliary means is therefore no longer necessary.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, exemplary is merely intended to mean an example, rather than the best.

LIST OF REFERENCE SYMBOLS

1: phase locked loop
2, 2A: controlled oscillator
3: charge pump
4: phase detector
5: frequency divider
6: evaluation device
7: pulse width generator
8: evaluation apparatus
9, 9A: comparison device
41: feedback input
42: reference input
43, 44: output terminals
51: control signal terminal
21: actuating signal input
31: actuating signal output
32, 35: charge pump
34, 912, 922: capacitor
33: voltage-current converter
66, 67: evaluation output terminals
91, 92: comparison circuit
incr, decr: inputs
P1, P2: pulse width control signals
RP: reference pulse
$f_{Ref}$: reference signal

The invention claimed is:

1. A phase locked loop comprising:
a phase detector having a reference input for supplying a first reference signal and having a feedback input, the phase detector outputting an actuating signal based upon a phase comparison of signals present at the reference input and at the feedback input;
a controlled oscillator having a control input, which is coupled to an output of the phase detector;
a frequency divider in a feedback path, the phase locked loop having an input connected to an output of the controlled oscillator, and having an output coupled to the feedback input of the phase detector; and
an evaluation means comprising;
a pulse generator circuit configured to generate a reference pulse signal having an adjustable pulse width, and
a comparison means configured to compare the actuating signal output by the phase detector with the reference pulse signal generated by the pulse generator circuit,
the evaluation means outputting a signal based upon the comparison made by the comparison means.

2. The phase locked loop of claim 1, wherein the evaluation means comprises a means for temporal averaging of the signal dependent on the comparison.

3. The phase locked loop of claim 2, wherein the means for temporal averaging comprises one or more capacitors.

4. The phase locked loop of claim 1, wherein the phase detector is designed for outputting a pulse-width-modulated actuating signal.

5. The phase locked ioop of claim 2, wherein the phase detector is designed for outputting a pulse-width-modulated actuating signal.

6. The phase locked loop of claim 1, wherein the evaluation means comprises an adjustable charge store, which is connected to a reference potential by one terminal and is connected to an output of a comparison circuit of the comparison device by its other terminal.

7. The phase locked loop of claim 6, wherein the charge store comprises one or more capacitors.

8. The phase locked loop of claim 2, wherein the evaluation means further comprises an adjustable charge store, which is connected to a reference potential by one terminal and is connected to an output of a comparison circuit of the comparison device by its other terminal.

9. The phase locked loop of claim 1, wherein the coupling of the output of the phase detector to the control input of the oscillator comprises a first charge pump and a second charge pump connected in parallel with said first charge pump, the second charge pump being designed to output a signal proportional to the actuating signal output by the phase detector.

10. The phase locked loop of claim 2, wherein the coupling of the output of the phase detector to the control input of the oscillator comprises a first charge pump and a second charge pump connected in parallel with said first charge pump, the second charge pump being designed to output a signal proportional to the actuating signal output by the phase detector.

11. The phase locked loop of claim 1, further comprising;
a charge pump that operatively couples the phase detector to the oscillator.

12. The phase locked loop of claim 11, wherein the charge pump functions as a low pass filter.

13. The phase locked loop of claim 1, wherein the controllable oscillatoris designed as a current-controlled oscillator.

14. The phase locked loop of claim 2, wherein the controllable oscillator is designed as a current-controlled oscillator.

15. A method for evaluating a jitter ota phase locked loop comprising:
providing a phase locked ioop having a phase detector configured to output a pulse-width-modulated actuating signal to an actuating output coupled to an oscillator;
providing a pulse width generator for generating a reference pulse signal having an adjustable pulse width;

comparing the pulse width of the reference signal with a pulse width of the actuating signal generated by the phase detector; and generating an evaluation signal for estimating a deviation of the actuating signal from the reference signal based upon the comparison.

16. The method of claim 15, wherein generating an evaluation signal comprises:

charging or discharging a charge store by a pulse width dependent on the comparison of the reference signal with the actuating signal; and generating the evaluation signal based on a voltage dropped across the charge store.

17. The method of claim 16, wherein the charge store comprises one or more capacitors.

18. The method of claim 15, further comprising:

assessing a voltage of the evaluation signal for an evaluation of a jitter of the phase locked loop.

19. A method for evaluating a jitter of a phase locked loop comprising:

generating a pulsed-width-modulated actuating signal in response to a comparison of a first reference signal with a feedback signal of an oscillator of the phase locked loop;

generating a reference pulse signal having an adjustable pulse width;

comparing the pulse width of the reference signal to a pulse width of the actuating signal; and generating an evaluation signal for estimating a deviation of the actuating signal from the reference signal based upon the comparison.

20. The method of claim 19, wherein the pulse-width-modulated actuating signal is provided by a phase detector, and the reference signal is provided by a pulse width generator.

* * * * *